(12) United States Patent
Heuer et al.

(10) Patent No.: US 6,610,361 B1
(45) Date of Patent: Aug. 26, 2003

(54) MULTI-LAYER ASSEMBLIES WITH PREDETERMINED STRESS PROFILE AND METHOD FOR PRODUCING SAME

(75) Inventors: Arthur H. Heuer, Cleveland, OH (US); Harold Kahn, Lakewood, OH (US); Jie Yang, Woodbury, CT (US); Stephen M. Phillips, Chesterland, OH (US)

(73) Assignee: Case Western Reserve University, Cleveland, OH (US)

( * ) Notice: Subject to any disclaimer, the term of this patent is extended or adjusted under 35 U.S.C. 154(b) by 0 days.

(21) Appl. No.: 09/449,790

(22) Filed: Nov. 26, 1999

Related U.S. Application Data

(63) Continuation-in-part of application No. 09/260,168, filed on Mar. 1, 1999, now Pat. No. 6,268,068.
(60) Provisional application No. 60/103,163, filed on Oct. 6, 1998.

(51) Int. Cl.$^7$ .......................... C23C 16/24; C23C 16/00; B05D 1/36
(52) U.S. Cl. .......................... 427/255.18; 427/255.15; 427/255.7; 427/402
(58) Field of Search .............. 427/255.15, 250, 427/252, 255.18, 255.7, 402, 419.1; 438/655, 652, 761, 763, 396

(56) References Cited

U.S. PATENT DOCUMENTS

| | | | |
|---|---|---|---|
| 3,856,647 A | 12/1974 | Blachman | |
| 3,900,597 A | 8/1975 | Chruma et al. | |
| 4,240,196 A | 12/1980 | Jacobs et al. | |
| 4,251,571 A | 2/1981 | Garbarino et al. | |
| 4,270,960 A | 6/1981 | Bollen et al. | |
| 4,441,249 A | * 4/1984 | Alspector et al. | 29/577 |
| 4,631,804 A | 12/1986 | Roy | |
| 4,742,020 A | 5/1988 | Roy | |
| 4,897,360 A | * 1/1990 | Guckel et al. | 437/7 |
| 5,059,556 A | 10/1991 | Wilcoxen | |
| 5,110,757 A | 5/1992 | Arst et al. | |
| 5,225,951 A | 7/1993 | Kira et al. | |
| 5,233,459 A | 8/1993 | Bozler et al. | |
| 5,287,081 A | 2/1994 | Kinard et al. | |
| 5,298,436 A | 3/1994 | Radosevich et al. | |
| 5,303,595 A | 4/1994 | Shoji et al. | |
| 5,319,479 A | 6/1994 | Yamada et al. | |
| 5,332,689 A | 7/1994 | Sandhu et al. | |
| 5,393,351 A | 2/1995 | Kinard et al. | |
| 5,627,407 A | * 5/1997 | Suhir et al. | 257/701 |
| 5,633,552 A | 5/1997 | Lee et al. | |
| 5,753,134 A | 5/1998 | Biebl | |
| 5,783,470 A | * 7/1998 | Rostoker | 438/253 |
| 5,863,659 A | 1/1999 | Kobayashi et al. | |

OTHER PUBLICATIONS

P. joubert et al., "The Effect of Low Pressure on the Structure of LPCVD Polycrystalline Silicon Films," J.Electrochem. Soc., vol. 134 No. 10, pp 2541–2544, 1987.*

(List continued on next page.)

*Primary Examiner*—Timothy Meeks
*Assistant Examiner*—Eric B. Fuller
(74) *Attorney, Agent, or Firm*—Fay Sharpe Fagan Minnich & McKee, LLP

(57) ABSTRACT

Multi-layer assemblies of polysilicon thin films having predetermined stress characteristics and techniques for forming such assemblies are disclosed. In particular, a multi-layer assembly of polysilicon thin films may be produced that has a stress level of zero, or substantially so. The multi-layer assemblies comprise at least one constituent thin film having a tensile stress and at least one constituent thin film having a compressive stress. The thin films forming the multi-layer assemblies may be disposed immediately adjacent to one another without the use of intermediate layers between the thin films. Multi-layer assemblies exhibiting selectively determinable overall bending moments are also disclosed. Selective production of overall bending moments in microstructures enables manufacture of such structures with a wide array of geometrical configurations.

21 Claims, 11 Drawing Sheets

OTHER PUBLICATIONS

Hyer et al., "Predicting the deformation characteristics of rectangular unsymmetrically laminated piezoelectric materials," *Smart Mater. Struct.,* 7(1998) pp 784–791.

Duke et al., "Strengthening Glass–Ceramics by Application of Compressive Glazes," *Journal of The American Ceramic Society,* vol. 51, No. 2 (1967) pp 98–102.

Kahn et al., "Mechanical Properties of Thick, Surface Micromachined Polysilicon Films," Proc. IEEE Micro Electro Mech. Syst. Workshop, MEMS 96, pp 343–348, 1996.

Kakinuma, "Comprehensive Interpretation of the Preferred Orientation of Vapor–Phase Grown Polycrystalline Silicon Films," *J. Vac. Sci. Technol.* A, vol. 13, No. 5, pp. 2310–2317, 1995.

Guckel et al. "Fine–Grained Polysilicon Films with Built–In Tensile Strain," *IEEE Transactions on Electron Devices,* vol. 35, No. 6, 1988, pp 800–803.

P. Joubert et al., "The Effect of Low Pressure on the Structure of LPCVD Polycrystalline Silicon Films," *J. Electrochem. Soc.,* vol. 134 No. 10, pp 2541–2544, 1987.

Huang et al., "Investigation of texture and stress in undoped polysilicon films," MRS Symposium Proceedings, vol. 182, pp. 201–206, 1990.

Yu et al., "Stress and microstructural evolution of LPCVD polysilicon thin films during high temperature annealing," MRS Symposium Proceedings, vol. 441, pp. 403–408, 1997.

Guckel et al., "The application of fine–grained, tensile polysilicon to mechanically resonant transducers," *Sensors and Actuators,* vol. A21–A23, pp 346–351, 1990.

Furtsch et al., "Comprehensive study of processing parameters influencing the stress and stress gradient of thick polysilicon layers," *SPIE Proceedings,* vol. 3223, pp 130–141, 1997.

Kirsten et al., "Deposition of thick doped polysilicon films with low stress in an epitaxial reactor for surface micromaching applications," *Thin Solid Films 259* pp 181–187 (1995).

Lange et al., "Thick polycrystalline silicon for surface–micromechanical applications: deposition, structuring and mechanical characterization," *Sensors and Actuators,* A 54 pp 674–678 (1996).

Furtsch et al., "Texture and stress profile in thick polysilicon films suitable for fabrication of microstructures," *Thin Solid Films* 296 pp. 177–180 (1997).

* cited by examiner

MULTI-LAYER ASSEMBLIES WITH PREDETERMINED STRESS PROFILE AND METHOD FOR PRODUCING SAME

CROSS REFERENCES TO RELATED APPLICATION

This application is a continuation-in-part application from U.S. application Ser. No. 09/260,168 filed Mar. 1, 1999, now U.S. Pat. No. 6,268,068 B1, which claims priority from U.S. Provisional Application Serial No. 60/103,163, filed Oct. 6, 1998.

This invention was made with government support under Grant No. NASA 342-9405 awarded by NASA, government has certain rights in this invention.

FIELD OF THE INVENTION

The present invention relates to multi-layer assemblies of thin films, such as for example, those formed from polysilicon. The thin films have predetermined stress characteristics. The present invention also relates to forming such thin films with desired stress profiles by controlling film formation conditions. By appropriately depositing variously stressed thin films and forming multi-layer assemblies therefrom, a resulting multi-layer assembly may be produced that exhibits a predetermined stress profile. The predetermined distribution of stresses in the multi-layer assembly may be sufficient, if desired, to induce geometrical effects such as curling or arcing of the assembly. A wide array of devices and applications are also disclosed that may utilize, or at least be based upon, the present invention.

BACKGROUND OF THE INVENTION

Polysilicon is one of the most widely used structural materials for microelectromechanical systems (MEMS) and devices. However, when deposited by low-pressure chemical vapor deposition (LPCVD) techniques, polysilicon films typically display high residual stresses and often stress gradients as well. These stresses, particularly when compressive, may cause released devices to bend and buckle, altering their original shapes and degrading their performances. While tensile stresses may promote planarity in doubly clamped designs, such stresses also increase stiffness and cause deformation of asymmetric features. Zero-stress polysilicon thin film structures would be optimal for many applications.

Prior artisans have attempted to produce thin silicon films with reduced stress levels. U.S. Pat. No. 5,753,134 entitled "Method for Producing a Layer With Reduced Mechanical Stresses" to Biebl, is directed to a method for producing a silicon layer having a reduced overall stress value, the layer being composed of two silicon sublayers. The first sublayer and the second sublayer are matched to one another such that the stresses in the two layers substantially compensate each other, and in effect, cancel each other out. However, Biebl requires that one or more auxiliary layers of silicon dioxide be provided between the sublayers. Those auxiliary layers require additional manufacturing or processing operations. Although satisfactory in some respects, a need still exists for an improved multi-layer polysilicon assembly and technique for forming, and particularly for an assembly that does not require the use of intermediate or auxiliary layers.

In addition, a disadvantage often associated with polysilicon films deposited by chemical vapor deposition techniques, pertains to the resulting relatively rough surface of the deposited film. Although approaches are known for producing films having relatively smooth finishes, typically, additional processing steps are necessary or critical process control schemes must be implemented. Accordingly, a need remains for a technique for producing films and multi-layer assemblies of such films having relatively smooth surfaces.

Recent efforts in the field of MEMS have been directed to producing microdevices and microstructures that exhibit a particular geometrical configuration. Often, it is desirable to produce curved or cantilevered geometries. However, given the relative small scale of such geometries, conventional microdevice fabrication techniques have been found to not be suitable, and in many instances, exhibit significant limitations. Accordingly, it would be desirable to provide a technique whereby microdevices and particularly microstructures, could be produced and which would exhibit a specific geometrical arrangement.

SUMMARY OF THE INVENTION

The present invention achieves the foregoing objectives and provides in a first aspect, a method for producing a multi-layer assembly of polysilicon thin films, such that the assembly has a predetermined overall bending moment. The method comprises forming a plurality of polysilicon thin film layers such that each layer exhibits a specific set of characteristics as follows. Each layer has either a devitrified microstructure and an internal tensile stress, or a predominantly columnar microstructure and an internal compressive stress. Each layer further exhibits a microstructure different than that of an adjacent thin film layer. Furthermore, each layer has a thickness and location in the multi-layer assembly such that the moments of each of the thin film layers sum to the predetermined overall bending moment.

In yet another aspect, the present invention provides a method for producing a multi-layer thin film assembly having a desired overall bending moment. The method comprises defining a total thickness for the multi-layer assembly. The method further includes defining a total number of thin film layers to constitute the multi-layer assembly. The method also includes defining a neutral plane that extends through the multi-layer assembly. The method further includes steps of forming each of the thin film layers according to a particular set of criteria as follows. Each layer has either a devitrified microstructure and an internal tensile stress or a predominantly columnar microstructure and an internal compressive stress. Each thin film layer has a microstructure that is different than the microstructure of an adjacent layer. And, each thin film layer is disposed at a location in the multi-layer assembly such that the moments of each of the thin film layers sum to the desired overall bending moment of the multi-layer assembly.

In yet a further aspect, the present invention provides a method of forming a multi-layer thin film assembly comprising a plurality of polysilicon thin films, such that the multi-layer assembly exhibits a selectively determinable overall bending moment. The method comprises steps of forming at least one first type of polysilicon thin film having either a devitrified microstructure and an internal tensile stress or a predominantly columnar microstructure and an internal compressive stress. The method also comprises steps of forming at least one second type of polysilicon thin film immediately adjacent to at least one of the first type of polysilicon thin films, such that the second type of polysilicon thin film has either a predominantly columnar microstructure and an internal compressive stress or a devitrified microstructure and an internal tensile stress. The microstructure of the second type of thin film is different than the microstructure of the first type of thin film. The method is performed such that the thin films are formed at particular locations in the multi-layer assembly such that the sum of the moments of each of the thin film layers corresponds to the overall bending moment desired for the multi-layer assembly.

In yet an additional aspect according to the present invention, a method for forming a smooth surface from a polysilicon material is provided. In this aspect, the polysilicon surface exhibits a RMS surface roughness value of less than 50 nm. The method comprises providing a substrate, and forming a polysilicon thin film having a devitrified microstructure and an internal tensile stress. The polysilicon thin film is deposited upon the substrate by chemical vapor deposition of silane at a temperature of from about 550° C. to about 590° C.

The present invention further provides multi-layer assemblies formed by each of the foregoing noted methods.

Further scope of the applicability of the present invention will become apparent from the detailed description given hereinafter. It should, however, be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The following is a brief description of the drawings which are present for the purpose of illustrating the invention and not for purposes of limiting the invention.

DETAILED DESCRIPTION OF THE PREFERRED EMBODIMENTS

In one aspect, the present invention provides a multi-layer assembly of two or more layers of polysilicon thin films. At least one of the polysilicon thin films is devitrified and exhibits a residual tensile stress. In addition, at least one of the polysilicon thin films is predominantly columnar and exhibits a residual compressive stress. The layers of the multi-layer assembly are preferably arranged within the multi-layer assembly such that the stresses of the polysilicon thin films alternate with respect to each other across the thickness of the assembly. The term "devitrified" as used herein refers to a microstructure in which the material is deposited in a generally amorphous, vitreous, or non-crystalline state. After deposition, sites within the material begin to form organized, non-amorphous and generally crystalline regions. However, the deposition parameters and system variables associated with the present invention are such that the material devitrifies or alters its structure after deposition, either before completion of that layer or during subsequent processing. The term "redominantly columnar" refers to material that is deposited in a generally crystalline state, or readily transforms to a crystalline state immediately upon or after deposition.

Figure 1:
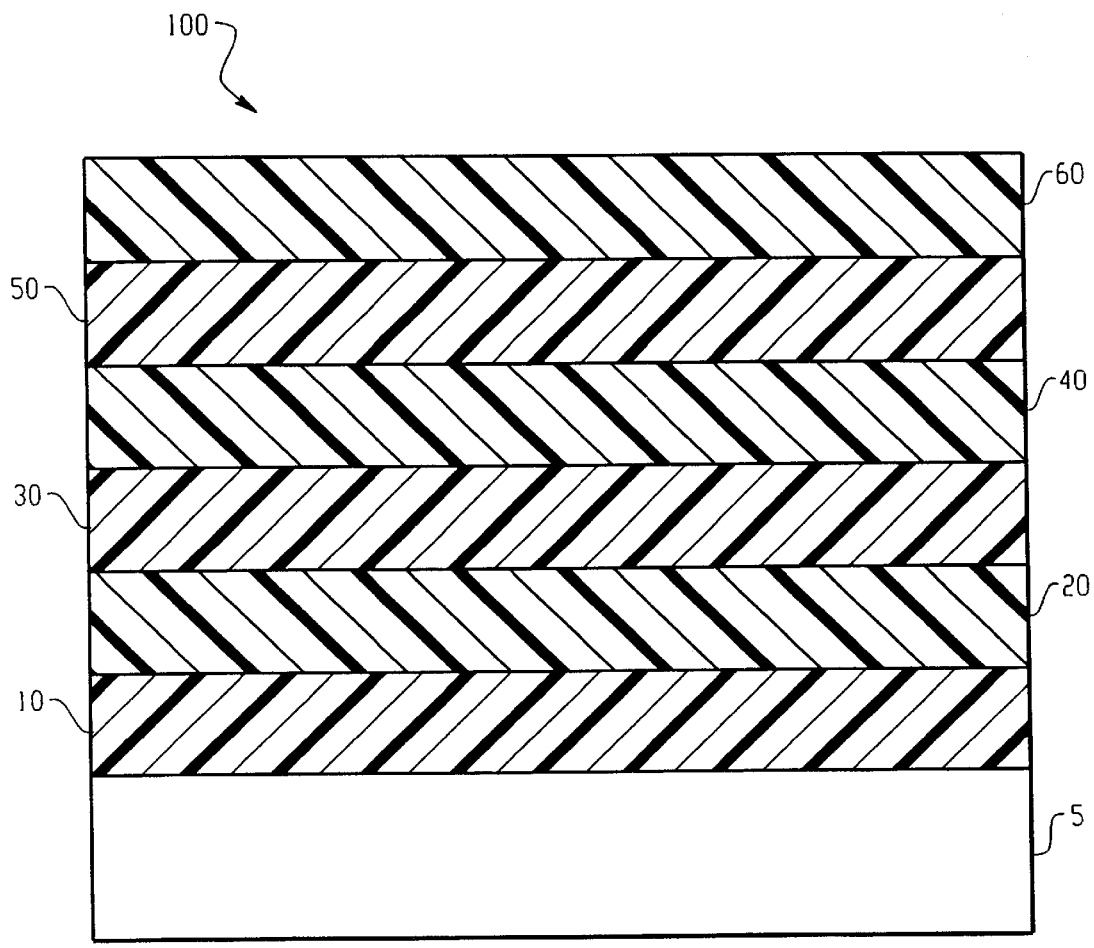
FIG. 1 is a schematic cross-sectional view of a preferred embodiment multi-layer polysilicon film in accordance with the present invention.

FIG. 1 is a schematic cross-sectional view of a preferred embodiment multi-layer polysilicon assembly 100 in accordance with the present invention. This multi-layer assembly according to the present invention is often referred to herein as the MultiPoly assembly. The process employed to produce such assembly, is generally referred to herein as the MultiPoly process. The multi-layer assembly 100 comprises a base or substrate 5, onto which are disposed a plurality of polysilicon thin films. A first polysilicon thin film 10 is deposited on the substrate 5 such that the thin film 10 is devitrified and has an inherent or residual tensile stress. A second polysilicon thin film 20 is deposited on the first devitrified thin film 10 such that the thin film 20 is predominantly columnar and has an inherent or residual compressive stress. A third polysilicon thin film 30 is deposited on the second polysilicon thin film 20 such that the thin film 30 is devitrified and has an inherent or residual tensile stress. A fourth polysilicon thin film 40 is deposited on the thin film 30 such that the thin film 40 is predominantly columnar and has an inherent or residual compressive stress. A fifth polysilicon thin film 50 is deposited on the fourth polysilicon thin film 40 such that the thin film 50 is devitrified and has an inherent or residual tensile stress. A sixth polysilicon thin film 60 is deposited on the thin film 50 such that the thin film 60 is predominantly columnar and has an inherent or residual compressive stress.

The arrangement of the thin films 10, 20, 30, 40, 50, and 60 may be reversed such that thin films 10, 30, and 50 have internal residual stresses that are compressive instead of tensile in nature. Similarly, in such an alternate arrangement, thin films 20, 40, and 60 have internal residual stresses that are tensile instead of compressive in nature.

The present invention provides a wide array of multi-layer thin film assemblies in addition to the six layer assembly depicted in FIG. 1. The present invention provides multi-layer assemblies having a number of thin films ranging from 2 up to 20 or more layers. The number of layers or thin films may be even or odd. However, as explained in greater detail below, it is preferable that the number of layers is odd in number, which offers the potential to control, and in particular to minimize, stress gradients.

One of the significant advantages of the present invention is that the various layers, e.g., 10 and 20, do not require intermediate or auxiliary layers disposed between them. That is, a first polysilicon thin film having either a residual inherent tensile or compressive stress, may be disposed immediately adjacent to another polysilicon thin film, i.e., a second film, having a residual inherent stress, different than that of the first film. This enables stacked assemblies to be formed with fewer processing steps and also enables stacked assemblies of shorter profile or height than if intermediate layers are included between one or more thin films. Yet another advantage of the present invention relates to etching. Typically, etching is much easier if there are no intermediate layers of composition different than the previously described primary layers.

The thickness or height of the multi-layer assemblies of the present invention varies depending upon the end use application. However, typical thicknesses for the resulting assemblies range from about 1 micron to about 10 microns. Similarly, the thickness of individual layers constituting the multi-layer assembly may span a relatively wide range. However, preferred thicknesses for the individual layers range from about 100 nm to about 1000 nm. As will be appreciated, the thickness of the multi-layer assembly is the sum of the thicknesses of the individual thin films.

In another aspect of the present invention, a technique is provided whereby a multi-layer assembly is provided that has a predetermined overall level and type of stress. The overall level and type of stress of the multi-layer assembly may be selectively obtained by controlling the stress characteristics and thickness of each individual thin film within the assembly. That is, by adjusting the thin film processing conditions during formation of each thin film, and by controlling the thickness of each thin film, desired stresses can be imparted to each of the individual thin films that form the multi-layer stacked assembly. And, therefore, the overall level and type of stress of the multi-layer assembly may be selectively produced. This technique is described below and in the examples herein. As will be appreciated, the overall type of stress, i.e. compressive or tensile, and the value or degree of such stress of the resulting multi-layer assemblies, is generally the sum of the individual stresses of each of the constituent layers of films forming the multi-layer assembly.

Another important and significant feature of the present invention relates to a remarkable discovery that polysilicon stacked assemblies having relatively smooth exterior surfaces can be produced. In accordance with the present invention, a polysilicon thin film having an exterior face with a surface finish roughness less than about 25 nm is provided (all surface roughness values expressed herein are root mean square, RMS, values). Ideally, preferred surface roughness is zero or near zero. However, it will be appreciated that perfectly smooth surfaces are not obtainable. In accordance with the present invention, a multi-layer assembly is produced having an outer face roughness value of 16.3 nm. Generally, surface roughness increases as the layer thickness increases. Thus, in forming a smooth face layer, it is preferred for such a layer to be relatively thin.

And, as described herein, layers deposited to have amorphous or devitrified microstructures generally produce smoother faces than layers having crystalline or predominantly columnar microstructures. Accordingly, low deposition temperatures, i.e. about 570° C. to about 580° C., are employed when depositing initial (bottom) and last (top) layers. This aspect is described in greater detail herein.

Table 1, set forth below, summarizes stress characteristics of single and multi-layer polysilicon thin films in accordance with the present invention, before and after annealing. This table summarizes a feature of the present invention, that multi-layer polysilicon films, produced in accordance with the present invention, are surprisingly stable in that upon being subjected to relatively high temperatures, their stress characteristics do not significantly change.

TABLE 1

Stress Characteristics of Single and Multi-Layer Polysilicon Films, Before and After Annealing

| No. of layers | Deposition temperature(s) (° C.) | Annealing temperature (° C.) for 1 hour in Nitrogen | Stress (MPa) (Tensile is Positive) |
|---|---|---|---|
| 1 | 550 | as-deposited | −201 |
|   |   | 615 | −123 |
|   |   | 615 (1 additional hour) | 184 |
| 1 | 570 | as-deposited | 189 |
|   |   | 615 | 265 |
|   |   | 615 (1 additional hour) | 264 |
| 1 | 580 | as-deposited | 170 |
|   |   | 1000 | 27 |
| 1 | 615 | as-deposited | −200 |
|   |   | 800 | −140 |
|   |   | 1000 | −97 |
|   |   | 1100 | −28 |
| 6 | 580/610 | as-deposited | 25 |
|   |   | 800 | 28 |
|   |   | 1000 | −3 |
|   |   | 1100 | −19 |
| 8 | 580/615 | as-deposited | 3 |
|   |   | 800 | 15 |
|   |   | 1000 | 5 |
|   |   | 1100 | −10 |
| 8 | 550/615 | as-deposited | −100 |
|   |   | 615 | −46 |
|   |   | 615 (1 additional hour) | −40 |
| 9 | 570/615 | as-deposited | 14 |
|   |   | 800 | 52 |
|   |   | 1000 | −11 |
|   |   | 1100 | −18 |
| 9 | 570/615 | as-deposited | −17 |
|   |   | 800 | 57 |
|   |   | 1000 | 0 |
|   |   | 1100 | −9 |
| 9 | 615/570 | as-deposited | −21 |
|   |   | 800 | 30 |
|   |   | 1000 | −15 |
|   |   | 1100 | −20 |

Table 2, set forth below, presents roughness measurements of layer of polysilicon deposited at 615° C., and a multi-layer polysilicon assembly comprising alternating layers of polysilicon, deposited at 580° C. and 615° C. All of these layers were deposited by LPCVD using silane. The surface roughness of the single layer was 70.7 nm, while the surface roughness of the outermost face of the exterior layer deposited at 615° C. was a surprisingly low 16.3 nm.

TABLE 2

Roughness Measurements

| No. of layers | Deposition temperature(s) (° C.) | RMS Roughness (nm) |
|---|---|---|
| 1 | 615 | 70.7 |
| 8 | 580/615 | 16.3 |

It is surprising and remarkable that the outer surface of the eight-layer assembly exhibited such a smooth finish, particularly as compared to the single layer. It will be appreciated that the microstructure of the single layer, and of the outermost layer of the multi-layer assembly were generally the same-predominantly columnar, since both layers were deposited at the same deposition temperature, 615° C.

Although the multi-layer thin film assembliess of the present invention can be formed via numerous processes, it is preferred that they be formed by chemical vapor deposition techniques.

Chemical vapor deposition (CVD) or thermal CVD is the deposition of atoms or molecules from a chemical vapor precursor, which contains the film material to be deposited. Chemical vapor precursors include chlorides such as titanium tetrachloride, $TiCl_4$; fluorides such as tungsten hexafluoride, $WF_6$; hydrides such as silane, $SiH_4$; carbonyls such as nickel carbonyl, $Ni(CO)_4$; and many others. Besides silane ($SiH_4$), polysilicon layers can be produced by CVD of dichlorosilane ($SiCl_2H_2$), or silicon tetrachloride ($SiCl_4$). Any of these gases can be used alone or with hydrogen. Decomposition of the vapor is preferably by chemical reduction or thermal decomposition. The reduction is normally accomplished by hydrogen at an elevated temperature. Some vapors, such as the carbonyls, can be thermally decomposed at relatively low temperatures. The deposited material may react with gaseous species such as oxygen, with a hydrocarbon gas such as methane or ammonia, or with a codeposited species to give compounds such as oxides, nitrides, carbides, and borides.

One such CVD chemical reaction is that of silane:

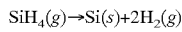

$$SiH_4(g) \rightarrow Si(s) + 2H_2(g)$$

which is a decomposition reaction.

CVD reactions are most often produced at ambient pressure in a freely flowing system. The gas flow, mixing, and stratification in the reactor chamber can be important to the deposition process. CVD can also be performed at low pressures (LPCVD) and in ultrahigh vacuum (UHVCVD) where the gas flow is molecular. The gas flow in a CVD reactor is very sensitive to reactor design, fixturing, substrate geometry, and the number of substrates in the reactor, i.e., reactor loading.

The CVD process is accomplished using either a hot-wall or a cold-wall reactor as known in the art. In the former, the whole chamber is heated and thus a large volume of processing gases is heated as well as the substrate. In the latter, the substrate or substrate fixture is heated, often by inductive heating. This heats the gas locally.

The gas flow over the substrate surface establishes a boundary layer across which precursor species must diffuse in order to reach the surface and deposit. In the cold-wall reactor configuration, the boundary layer defines the temperature gradient in the vapor in the vicinity of the substrate. This boundary layer can vary in thickness and turbulence, depending on the direction of gas flow. Direct impingement of the gas on the surface reduces the boundary layer thickness and increases the temperature gradient, whereas stagnant flow regions give much thicker boundary layers.

Each heating technique has its advantages and disadvantages, and changing from one technique to another may involve significant changes in the process variables. The cold-wall reactor is most often used in small size systems. The hot-wall reactor, by contrast, is most often used in large volume production reactors.

CVD processing can be accompanied by volatile hot reaction by-products such as HCl or HF, which, along with unused precursor gases, must be removed from the exhaust gas stream. This is done by scrubbing the chemicals from the gas using water to dissolve soluble products or by burning the precursor gases to form oxides.

In many cases, the deposited material can retain some of the original chemical constituents, such as hydrogen and silicon from the deposition from silane, or chlorine and tungsten from the deposition from $WCl_6$. This can be beneficial or detrimental. For example, the retention of hydrogen and silicon allows the deposition of amorphous silicon, a-Si:H, which is used in solar cells.

The gases used in the CVD reactor may be either commercially available gases in tanks, such as Ar, $N_2$, $WF_6$, $SiH_4$, $B_2H_6$, $H_2$, and $NH_3$; liquids such as chlorides and carbonyls; or solids such as Mo carbonyl, which has a vapor pressure of 10 Pa (75 mtorr) at 20° C. and decomposes at temperatures greater than about 150° C. Vapor may also come from reactive bed sources where a flowing halide, such as chlorine, reacts with a hot-bed material, such as chromium or tantalum, to give a gaseous species.

Vapor from liquids can be put into the gas stream by bubbling the hydrogen or a carrier gas through the liquid or by using a hot surface to vaporize the liquid into the gas stream. Liquid precursors are generally metered onto a hot surface using a peristaltic pump and the gas handling system is kept hot to keep the material vaporized. In some cases, the vapor above a liquid may be used as the gas source.

Reactive bed sources use heated solid materials, e.g., chips and shavings, over which a reactive gas flows. The reaction produces a volatile gaseous species that can then be used as the precursor gas. By controlling the reaction bed parameters, the stoichiometry of the resulting gas can be controlled.

The morphology, composition, crystalline structure, defect concentration, and properties of CVD-deposited material depend on a number of factors. An important variable in the CVD reaction is the effect of vapor supersaturation over the substrate surface and the substrate temperature. At low supersaturations, which also give a low deposition rate, nuclei initiate on isolated sites and grow over the surface, giving a high density film. At high temperatures and low supersaturations of the vapor, epitaxial growth (oriented overgrowth) can be obtained on appropriate substrates. This vapor phase epitaxial (VPE) growth is used to grow doped layers of semiconductors, e.g., Si doped with B on Si. At intermediate concentrations, a nodular growth structure may form.

Many materials deposited by CVD have a high elastic modulus and a low fracture toughness and are therefore affected by residual film stresses. Film stress arises owing to the manner of growth and the coefficient of expansion mismatch between the substrate and film material. In many CVD processes, high temperatures are used. This restricts the substrate coating material combinations to ones where the coefficient of thermal expansions can be matched. High temperatures often lead to significant reaction between the deposited material and the substrate, which can also introduce stresses.

Processing variables that affect the properties of the thermal CVD material include the precursor vapors being used, substrate temperature, precursor vapor temperature gradient above substrate, gas flow pattern and velocity, gas composition and pressure, vapor saturation above substrate, diffusion rate through the boundary layer, substrate material, and impurities in the gases.

Safety is often a primary concern in CVD processing because of the hazardous nature of some of the gases and vapors that are used and the hot reaction products generated.

The density of CVD deposits is generally high (>99%), but dendritic or columnar growth can decrease the density. High purity films can be attained but incomplete decomposition of the precursor gases can leave residuals in the deposits particularly at low deposition temperatures. The CVD deposition process, is overall, relatively attractive, but the properties of the deposit often depend on deposition rate, gas flow impingement rate and direction. CVD deposition rates can range from less than 10 to more than 300 microns/hour and generally have no restriction on thickness. The thickness of a CVD deposit is determined by the processing parameters and can range from very thin films to thick coatings to free-standing shapes.

The microstructure and crystallographic texture of polysilicon deposited by LPCVD (usually involving the thermal decomposition of silane) is determined mainly by the deposition temperature and the partial pressure of the reactant gases (e.g. silane) and to a lesser extent the presence of hydrogen carrier gas. It is generally believed that at low deposition temperatures and high silane pressures, the deposited films are initially amorphous and subsequently crystallize, i.e. become devitrified. As the temperature is increased and the silane pressure decreased, the films become columnar or predominantly columnar with regimes of preferred orientation that change from (311) to (110) to (100) and finally to a random orientation at the highest temperatures and lowest pressures. At a typical silane pressure of 300 mtorr, films deposited below 580° C. are devitrified. At such pressures, films deposited at temperatures from 580° C. to 600° C. are predominantly columnar with a (311) texture. At the same pressures, films deposited at temperatures from 600° C. to 700° C. exhibit a (110) texture and a columnar microstructure on top of an initial equiaxed nucleation layer. And, at such pressures, films deposited above 700° C. are predicted to have a (100) texture and a columnar microstructure. However, these specific deposition parameters are only approximate and will vary between different deposition systems. For example, some researchers never encounter the (311) texture regime (that is the case for the preferred embodiment films deposited at 580° C. and described herein), while others have reported varying microstructures among films deposited on different wafers within the same furnace.

Previous reports have stated that any depositions below 580° C. will be amorphous. However, the present inventors have found that films deposited at 570° C. and 580° C. have devitrified microstructures, while films deposited at 550° C. are amorphous and generally remain amorphous unless heated during subsequent processing to temperatures of approximately 570° C. or above. It is likely that any pressure between about 100 to about 500 mtorr, similar trends will be observed. The present inventors currently believe that 570° C. may be the optimum temperature for forming the devitrified layers as described herein. This temperature is high enough so that the deposition rate is acceptable, and it is low enough that there should be no columnar nature to these layers. However, depending upon other process and system parameters, it is contemplated that deposition temperatures from about 550° C. to about 590° C. may be utilized to form the devitrified layers described herein. Deposition at any temperature between about 600° C. and about 700° C., preferably about 605° C. to about 650° C., and most preferably about 615° C., should result in a columnar, or at least predominantly columnar polysilicon film exhibiting compressive stress.

Preferably, during the deposition of the various layers in forming the multi-layer assembly, temperature adjusting equilibrium time periods are employed between deposition of the individual layers. This practice ensures that the substrate or partially formed multi-layer assembly is at a common and uniform temperature, and that the temperature is the desired deposition temperature. For example, if the temperature of the substrate or stack is at 570° C., and it is desired to deposit the next layer at 615° C., the temperature is ramped up to that temperature within a time period of about 25 minutes. Then, the next layer is deposited at the desired higher temperature, i.e. 615° C. After completion of the formation of that layer, if it is then desired to deposit another layer at a lower temperature, for instance, 570° C., another temperature adjusting time period is allowed to pass. In the case of having previously deposited a layer at 615° C. and desiring to next deposit a layer at 570° C., the present inventors have determined that a suitable temperature cooling period is about 30 minutes. The optimal temperatures and adjusting time periods may vary depending on the LPCVD equipment used.

As described herein, films deposited in the transition region between the amorphous and columnar regimes contain randomly oriented very small (~0.1 $\mu$m) crystallites. The devitrified microstructure is believed to arise from crystallization (via homogeneous nucleation) of the amorphous silicon film during the later stages of the deposition, or during subsequent heat treatment. This explanation is supported by observations that partially crystallized films are only crystallized at the bottom (substrate interface) region but amorphous at the external face (gas interface). Furthermore, slightly coarser devitrified microstructures result from fine-grained devitrified films which are subsequently annealed at elevated temperatures to induce grain coarsening.

Most importantly for microelectromechanical applications, these fine-grained devitrified polysilicon films exhibit tensile residual stresses, while the coarser polycrystalline columnar films deposited at higher temperatures exhibit compressive residual stresses. The tensile stresses in the fine-grained devitrified polysilicon are believed to result from the volume change during crystallization from the amorphous state. The compressive stresses in the polysilicon deposited at high temperatures are not well understood, though hydrogen incorporation has been postulated as part of the cause since the stresses in both the nucleation and columnar layers are similar. Relatively thick columnar films display a much rougher surface than fine-rained films, due to the semi-spherical morphology of the peaks of the individual columnar grains.

The present invention provides a novel technique of utilizing multiple layers of LPCVD or CVD polysilicon deposited at varying temperatures, such that a composite film is formed which is comprised of alternating tensile and compressive layers. Thin films of polysilicon having a generally devitrified structure and an inherent tensile stress may be formed by CVD of silane at a temperature of about 570° C. Thin films of polysilicon having a generally predominantly columnar structure and an inherent compressive stress may be formed by CVD of silane at a temperature of about 615° C. In this manner, if the thicknesses of each of the individual layers are appropriately controlled, the overall stress of the polysilicon may range between that of a tensile fine-grained layer and a compressive columnar layer. The present inventors have demonstrated this unique and remarkable discovery by forming multiple layer films having overall residual levels of stress of zero, or substantially so.

Figure 2:
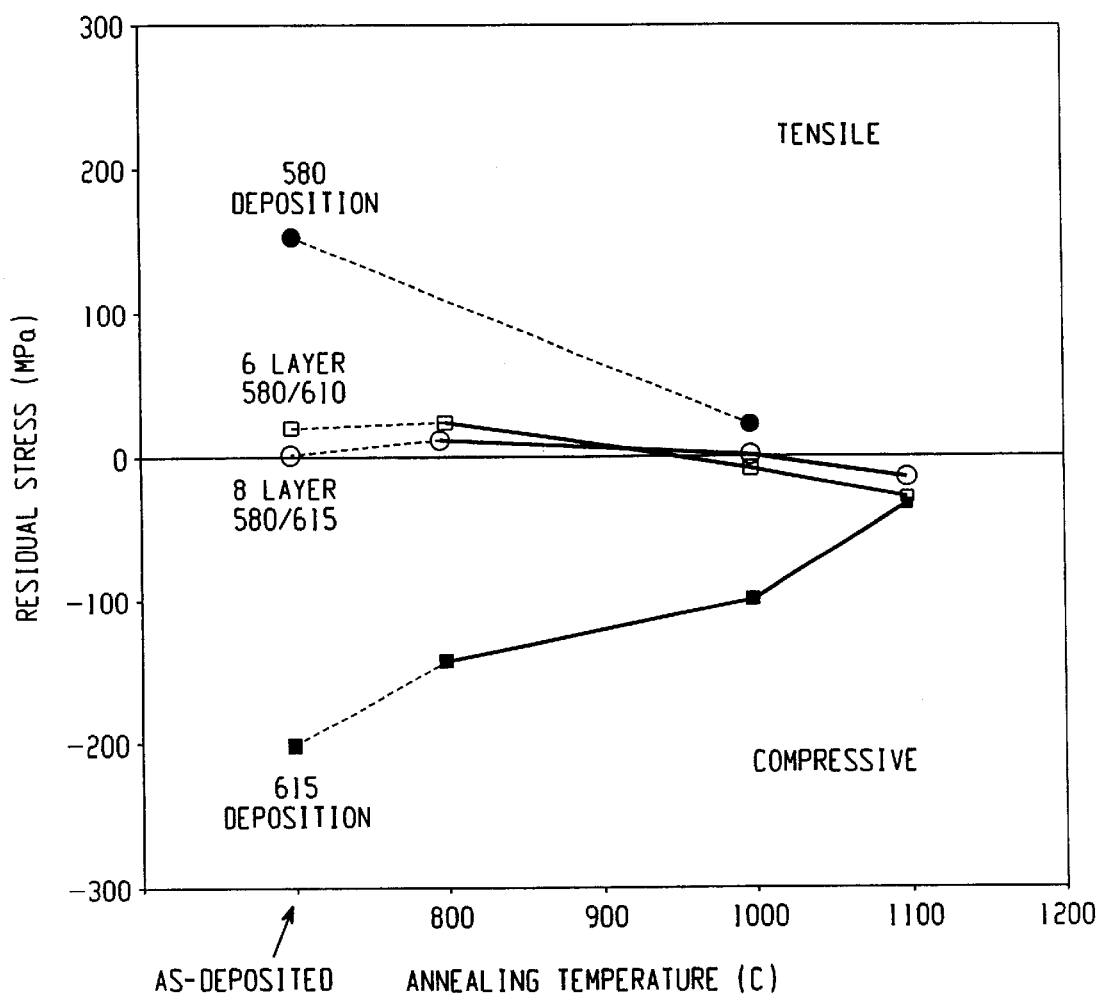
FIG. 2 is a graph illustrating stress in multi-layer polysilicon films as a function of temperature.

In accordance with the present invention, polysilicon films were deposited via LPCVD in a hot-walled furnace using silane at a pressure of 300 mtorr and a flow rate of 200 sccm at temperatures from 550° C. to 615° C. Some of the films were studied in the as-deposited state, while other films were annealed in flowing nitrogen for one hour at various temperatures. The stresses of the newly deposited and annealed films were measured as shown in FIG. 2 using a laser-reflected wafer curvature technique. The film deposited at 580° C. was at least partially crystalline as-deposited, as determined by x-ray diffraction and transmission electron microscopy (TEM) of cross-sectional samples, and was 5 microns thick, utilizing a deposition time of 1100 minutes. The film deposited at 615° C. was 5 microns thick, had a columnar microstructure, and utilized a deposition time of 600 minutes. A six layer film was deposited by varying the temperature in the furnace between 610° C. (for the odd layers) and 580° C. (for the even layers). While the temperature was ramping, the silane flow was stopped. The total thickness was 3.6 microns, using a deposition time of 194 minutes for each odd layer and 125 minutes for each even layer. An eight layer film was deposited in the same fashion as the six layer film, except that the even layers were deposited at 615° C. for 125 minutes each, and there were 2 additional layers. The total thickness was also 3.6 microns.

As seen in FIG. 2, the preferred embodiment polysilicon films deposited at 580° C. and 615° C. in accordance with the present invention, display tensile and compressive as-deposited residual stresses, respectively. The six layer film exhibits a low tensile stress, about 30 MPa, and the eight layer film exhibits a near-zero residual stress. Although annealing alters the stresses of the polysilicon films deposited at a single temperature, the near-zero stress state of the eight layer film is extremely stable up to 1000° C. Such stability demonstrates the immunity and resistance of the layered film to further process steps and enhances its value for microelectromechanical processing. The use of several (6 or 8) thin layers to create a thick film has an additional important advantage in that the procedure reduces the surface roughness by preventing columnar grains from developing rounded crests.

Figure 3:
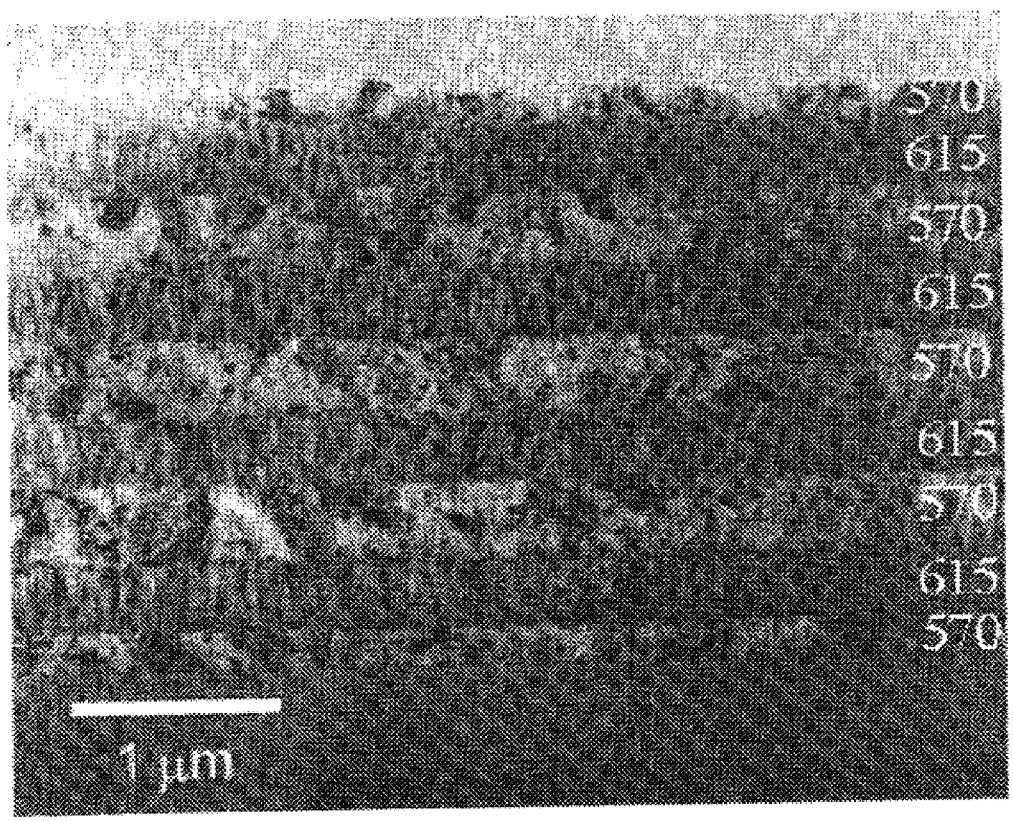
FIG. 3 is a transmission electron micrograph of a cross section of a preferred embodiment nine layer polysilicon film in accordance with the present invention.

FIG. 3 is a cross-sectional transmission electron micrograph of a preferred embodiment nine layer film in accordance with the present invention. The fine grained microstructures of the odd layers and the columnar microstructure of the even layers are apparent. It is significant that the multilayer assembly shown in FIG. 3 does not require, and thus does not utilize, any type of intermediate layer(s) between the alternating layers of polysilicon.

Figure 4:
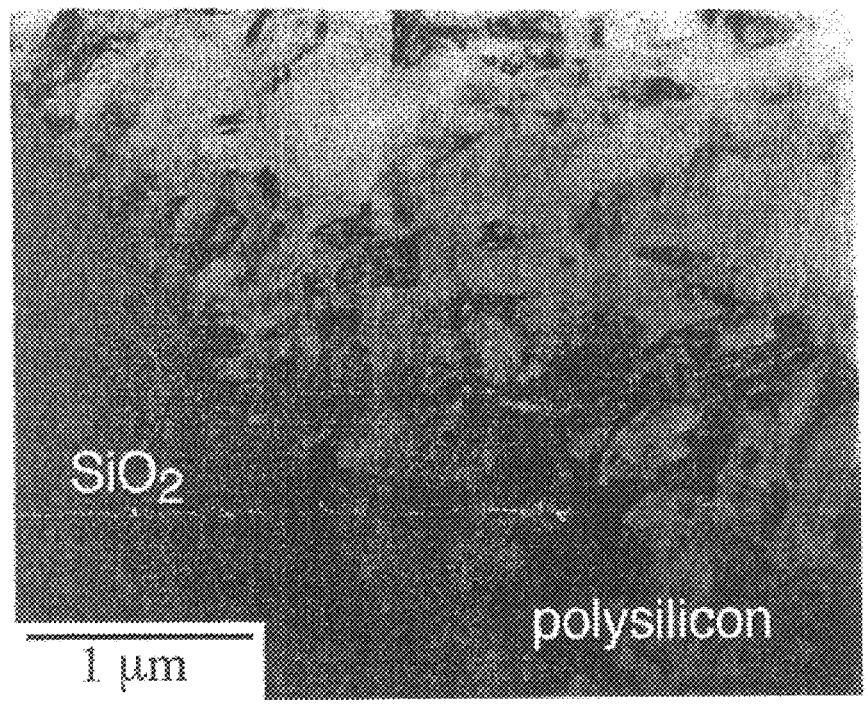
FIG. 4 is a transmission electron micrograph of a cross section of a preferred embodiment single, generally devitrified layer of polysilicon deposited at a temperature of 580° C.

Similarly, FIG. 4 is a transmission electron micrograph of a cross section of a preferred embodiment single, generally devitrified layer of polysilicon formed at 580° C. A neighboring region (shown on the left hand side of FIG. 4) of silicon dioxide is shown. FIG. 4 demonstrates that the process of devitrification is slightly slower than the rate of film growth or deposition.

Figure 5:
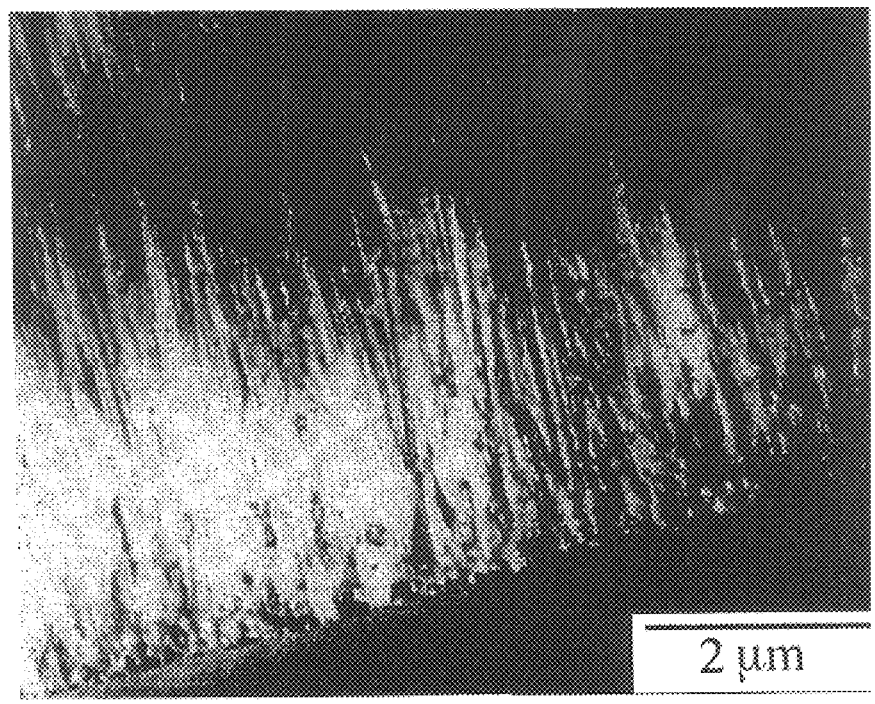
FIG. 5 is a transmission electron micrograph of a cross section of a preferred embodiment single, generally predominantly columnar layer of polysilicon deposited at a temperature of 615° C.

FIG. 5 is a transmission electron micrograph of a cross section of a preferred embodiment single, generally columnar layer of polysilicon formed at 615° C.

By using alternating layers of tensile and compressive polysilicon, films can be deposited and imparted with any stress value between those of the individual layers.

While the multi-layer thin film assembly shown in FIG. 3 has a zero overall residual stress, the thicknesses of the individual polysilicon layers can be adjusted to achieve any overall film stress which lies between the individual 570° C. tensile and 615° C. compressive polysilicon film stresses, which film stresses are in the range of about 300 to 350 MPa.

Figure 6A:
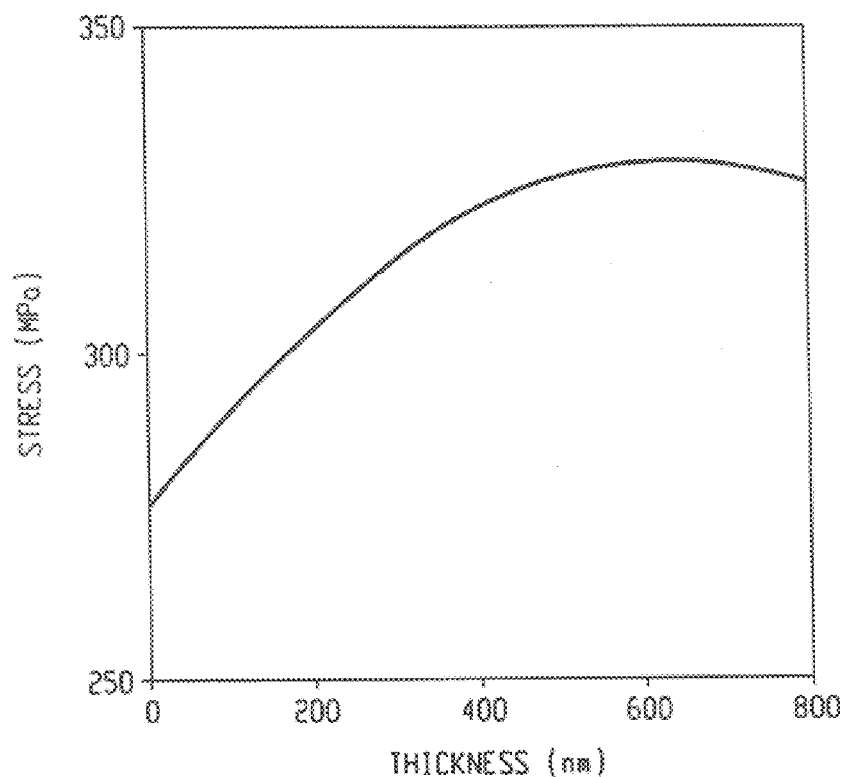
FIG. 6A is a stress profile for a preferred embodiment tensile polysilicon film deposited at 570° C.
Figure 6B:
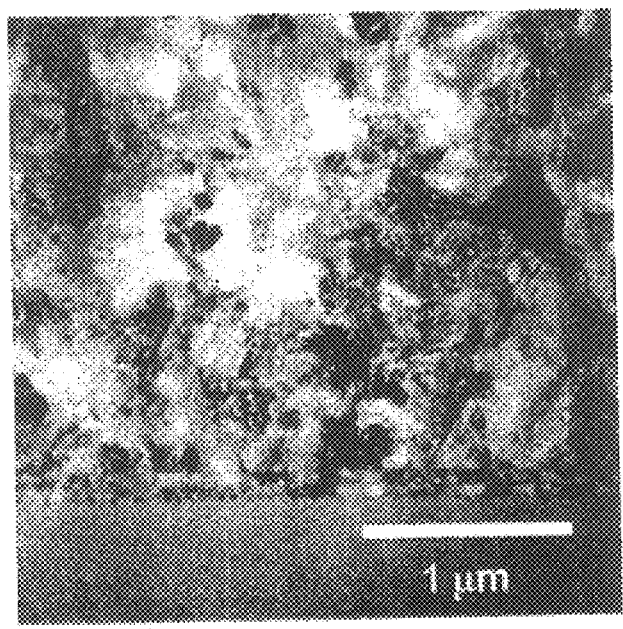
FIG. 6B is a transmission electron micrograph of a cross section of the film illustrated in FIG. 6A.
Figure 7A:
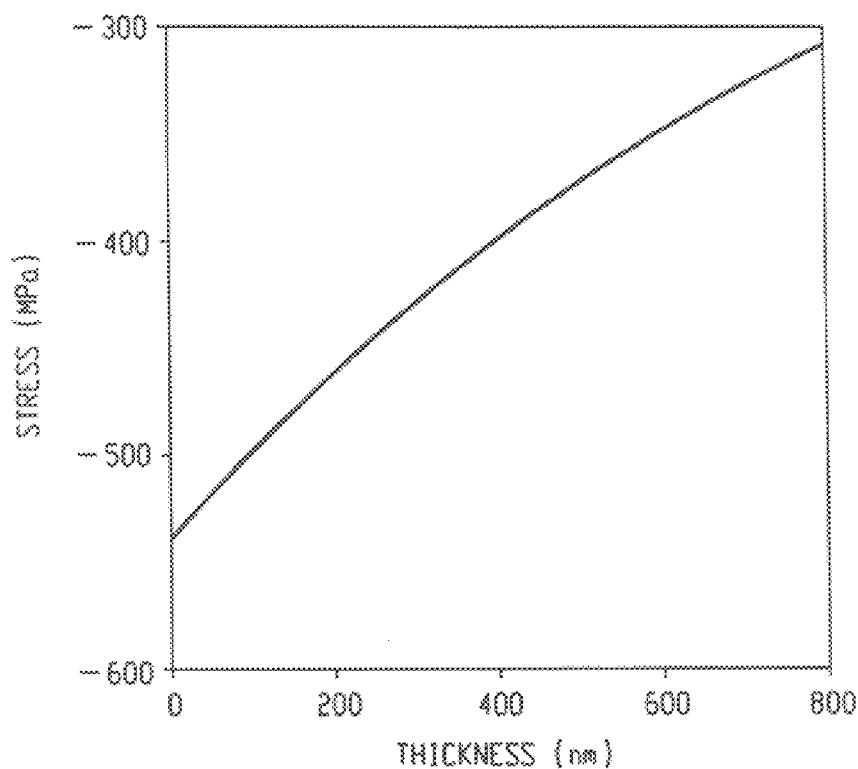
FIG. 7A is a stress profile for a preferred embodiment compressive polysilicon film deposited at 615° C.
Figure 7B:
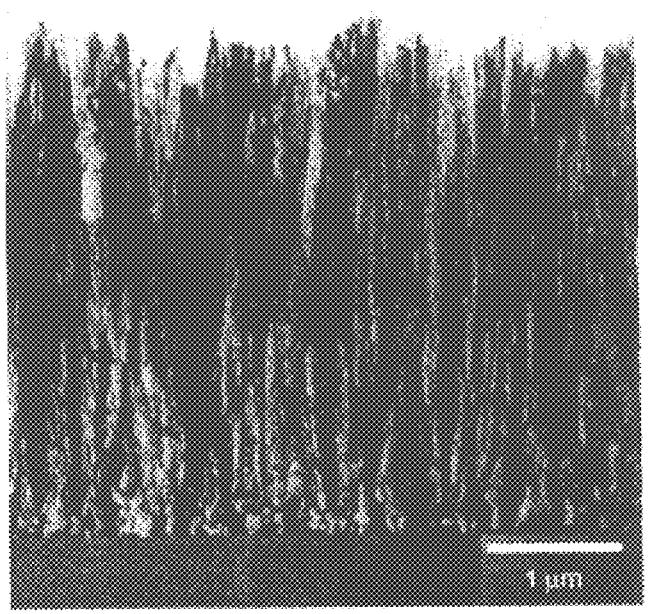
FIG. 7B is a transmission electron micrograph of a cross section of the film illustrated in FIG. 7A.

Actually, regardless of whether the residual stress is tensile (570° C. deposition) or compressive (615° C. deposition), the stress in any layer whose thickness is less than approximately 1 $\mu$m primarily depends on the layer thickness. The stress profile for a single tensile layer deposited at 570° C. is shown in FIG. 6A, while the stress profile of a single compressive layer is shown in FIG. 7A. As can be seen, the tensile stress increases from approximately 275 MPa in very thin films to a maximum stress of about 330 MPa for 0.6 $\mu$m films. Films with thicknesses of 0.8 $\mu$m and above display tensile stresses of about 320 MPa. Very thin compressive layers have residual stresses as high as about 550 MPa, which decrease to stress levels of about 300 MPa for layer thickness of 0.8 $\mu$m and above.

These residual stress gradients have been of great concern in the field of microelectromechanical systems and must also be considered in zero residual stress MultiPoly assemblies. To explain this, it is best to consider single layer films first. The stress gradients of either the tensile or compressive polysilicon films shown in FIGS. 6A, 6B and 7A, 7B would cause structures comprised of these films to bend upwards away from their underlying substrates, when released from their respective substrate. This is due to a greater tensile stress at the top of the film in the case of the 570° C. polysilicon, and due to a greater compressive stress at the bottom of the film in the case of the 615° C. polysilicon. However, it is possible to control the residual overall stress gradient in MultiPoly assemblies, by careful control of the thickness of both types of layers or thin films. In fact, MultiPoly assemblies can be formed to exhibit any value of stress gradient which lies between zero and the stress gradient of a bi-layer consisting of one 570° C. polysilicon layer and one 615° C. polysilicon layer. Furthermore, the gradient can be either positive or negative, depending on which layer is on top and which is on bottom.

At this juncture, it is instructive to consider a brief review of how stresses imparted or exhibited within a layer or region of material may distort or induce a change in the geometrical configuration of the layer or region of material. Reference is made herein to the bending moment of a particular thin layer or region of multi-layer assembly under review. Generally, the bending moment of a layer or thin film is equal to the sum of the external forces and moments acting upon the layer. Restated, the bending moment is equal to the moment of the internal stress forces at the layer. This moment may be approximated by multiplying the stress associated with the layer by the distance between that layer and what is often referred to as the neutral plane, described below.

For multi-layer thin film assemblies that exhibit non-zero bending moments, a neutral plane will exist by definition, through the assembly along a region of zero stress. The neutral plane separates one region of the assembly which is in tension from another region of the assembly which is in compression.

A significant aspect of the neutral plane is that the location of the plane affects the computation of the overall bending moment of the assembly. This is because the stress intensity at any region in the assembly varies directly with the distance between the region of interest and the neutral axis.

The overall bending moment of a multi-layer thin film assembly may be approximated by algebraically summing together the individual bending moments associated with each of the thin films in the assembly. The bending moment of each individual layer or thin film is approximated by multiplying the stress associated with that layer by the distance that layer is from the neutral plane. For most of the multi-layer assemblies described herein, the neutral plane corresponds to the midpoint of the thickness of the assembly.

Figure 8C:
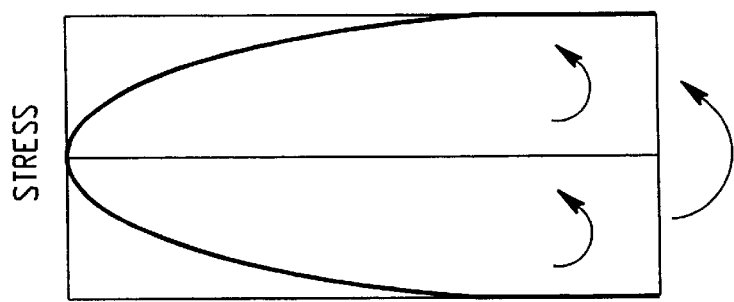
FIG. 8C is a stress profile for a preferred embodiment two layer film, each layer of equal thickness, with arrows indicating direction of bending moment.
Figure 8B:
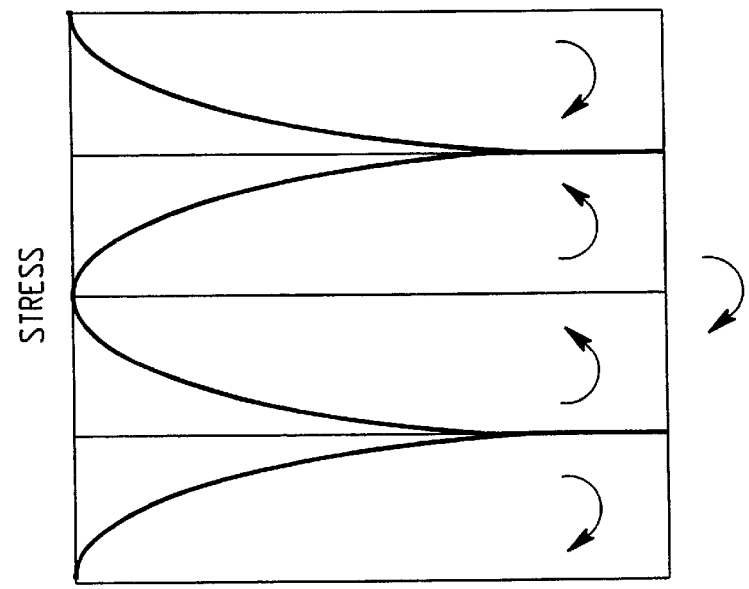
FIG. 8B is a stress profile for a preferred embodiment four layer film, each layer of equal thickness, with arrows indicating direction of bending moment.
Figure 8A:
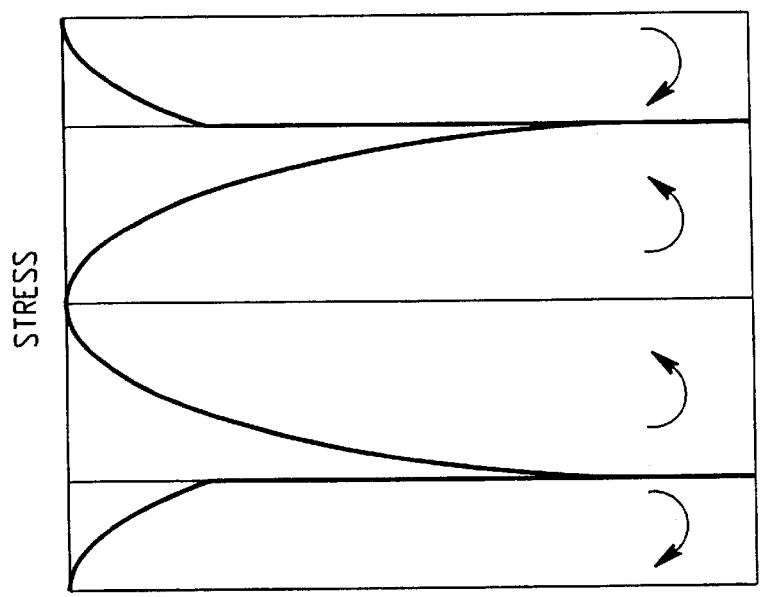
FIG. 8A is a stress profile for a preferred embodiment four layer film, the layers having different thicknesses, with arrows indicating direction of bending moment.

To understand how control of both the overall residual stress and residual stress gradients in MultiPoly assemblies is achieved, consider the simple hypothetical examples shown in FIG. 8. The stress in each individual layer can be either tensile or compressive. But, the stress profiles in both types of layers have the same dependence on thickness. It is clear that the two layer film and both four layer films in FIGS. 8A–8C have zero overall residual stress. However, by controlling the thickness of the outer layers, multi-layer assemblies can be produced with a zero bending moment (FIG. 8A) or with a finite bending moment (FIGS. 8B and 8C). Specifically, referring to FIG. 8C, the two layer assembly exhibits a relatively high total bending moment which results from the sum of the individual bending moments associated with the respective layers. The individual bending moments are additive since they are in the same direction. Referring to FIG. 8B, the four layer film, each layer of equal thickness, exhibits a relatively low total bending moment that results from the sum of the individual bending moments associated with each of the respective layers. It will be appreciated that the bending moments in the outer layers (with respect to the assembly thickness midpoint) are slightly greater than the bending moments in the inner layers (even though all layers are of equal thickness) because the outer layers are farther from the thickness midpoint than are the inner layers. As previously noted, the thickness midpoint may be considered as the neutral axis. Concerning FIG. 8A, the four layer assembly exhibits a zero total bending moment. Such zero bending moment results from summing each of the individual bending moments. It will be understood that the relatively thin outer layers produce a total bending moment that is equal to, but for its direction or sign, the total bending moment of the two thicker inner layers. Again, the reason for this is the relative location of each layer with respect to the neutral axis, i.e. the thickness midpoint of the multi-layer assembly.

Figure 9:
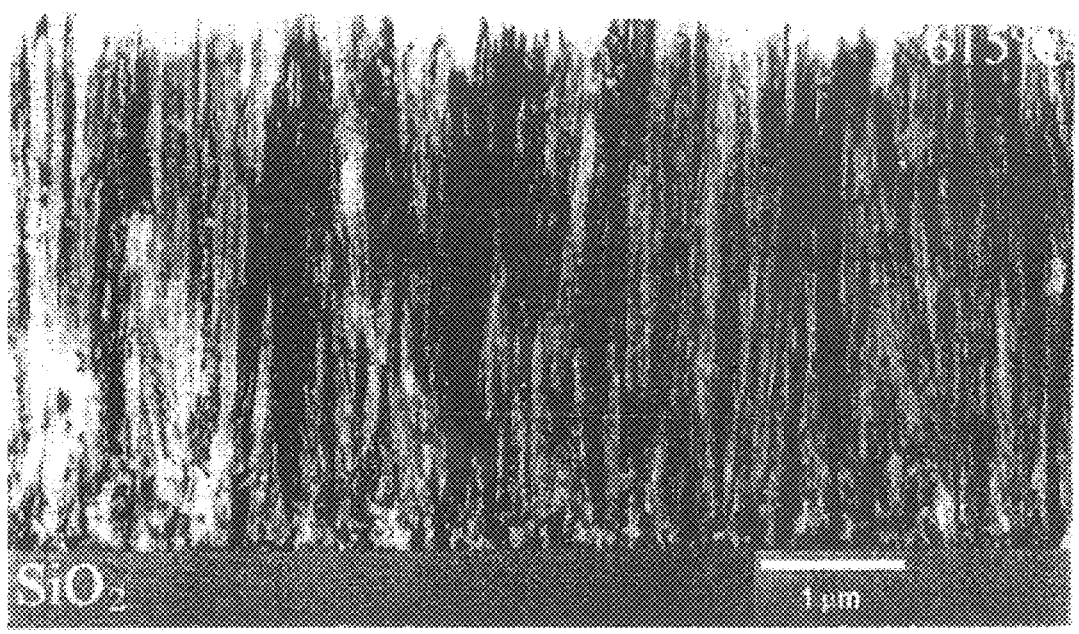
FIG. 9 is a transmission electron micrograph of a cross section of a single layer film deposited at 615° C.
Figure 10A:
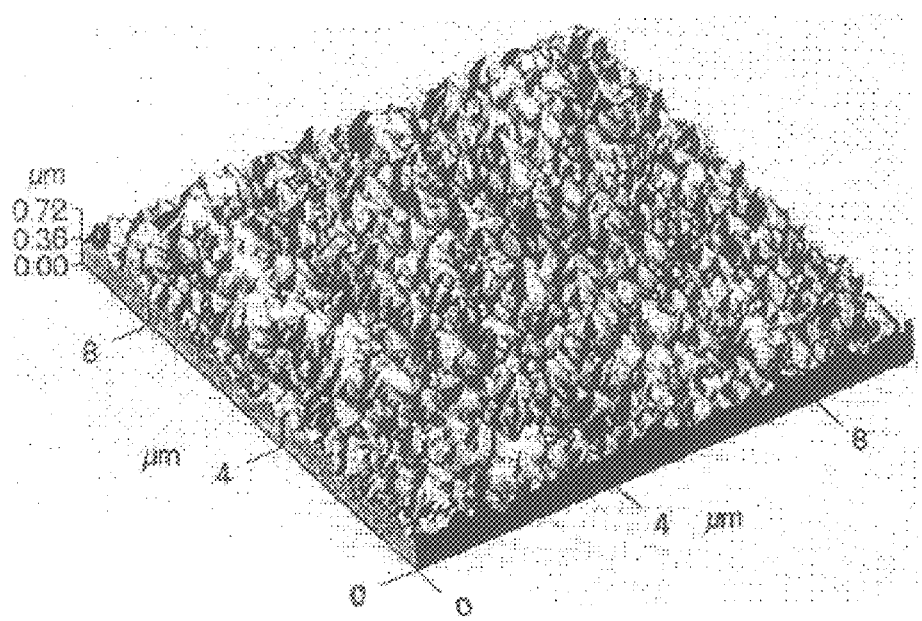
FIG. 10A is an AFM image of a surface of the single layer film illustrated in FIG. 9.
Figure 10B:
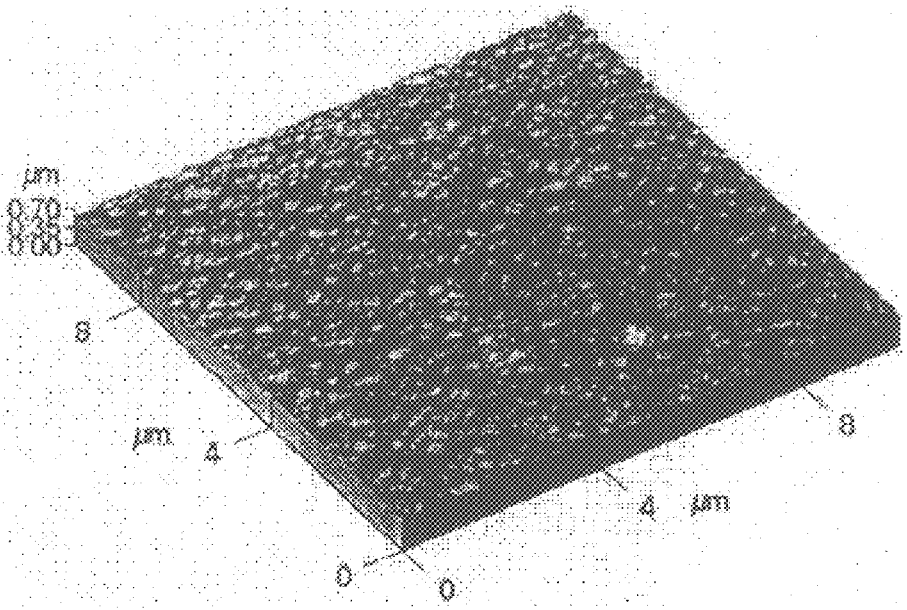
FIG. 10B is an AFM image of a surface of an outermost layer of a preferred embodiment multi-layer assembly.

As previously noted, the MultiPoly process has yet another very useful attribute. FIG. 9 illustrates a relatively thick (about 4 $\mu$m) single layer film deposited at 615° C. Due to the columnar microstructure, the as-deposited surface finish is rather poor, and an AFM determination of the surface roughness (FIG. 10A) yields a RMS roughness of 70.7 nm. In contrast, a MultiPoly assembly with the microstructure of FIG. 1 has a mirror finish and a RMS surface roughness of 16.3 nm (FIG. 10B). Films deposited at 570° C. are initially amorphous and very smooth. During film growth, crystallization occurs, which leads to the structure shown in FIG. 6B but does not change the surface finish. Deposition of amorphous silicon is conformal. Such deposition and the fact that the development of this columnar microstructure of the 615° C. layers is impeded results in the much improved surface finish of the MultiPoly silicon.

In accordance with the present invention, RMS surface finishes for the thin layer films described herein, of less than about 50 nm, and preferably less than about 25 nm are obtainable. As described herein, such smooth surface finishes are produced upon layer formation and avoid the requirement for post forming operations such as conventional smoothing techniques. As described herein, such smooth outer surfaces result from a choice of microstructure (e.g. devitrified) in the outermost layer, and using relatively thin layers, particularly as the outermost layer. This improved surface finish has salutary consequences for the optical MEMS applications noted herein. Before discussing these applications, however, one other most useful aspect of the MultiPoly process must be discussed.

For many applications, the advantages of the MultiPoly process result from the ability to produce very large and very flat surface micromachined structures, through control of both the residual stress and residual stress gradients. However, residual stress gradients may be designed or selectively formed so that useful shaped components may be produced upon release of the multi-layer assembly from an underlying substrate.

As an example of this technique, a 2 $\mu$m thick polysilicon film can be designed such that a 500 $\mu$m diameter circle etched from this film will display a semi-circular shape with a radius of curvature of 2 mm, when released from the substrate. This film can be formed by depositing the following five multilayers, followed by a one hour anneal at 615° C. to fully crystallize the last layer:

1) a 0.22 $\mu$m film deposited at 570° C.
2) a 0.41 $\mu$m film deposited at 615° C.
3) a 0.59 $\mu$m film deposited at 570° C.
4) a 0.42 $\mu$m film deposited at 615° C.
5) a 0.36 $\mu$m film deposited at 570° C.

Another example illustrating aspects and features of the present invention is as follows. A 3 $\mu$m thick polysilicon film can be designed such that a 500 $\mu$m diameter circle etched from this film will display a semi-circular shape when released from the substrate with a radius of curvature of 2 mm. This film can be formed by depositing the following five multilayers, followed by a one hour anneal at 615° C. to fully crystallize the last layer:

1) a 0.32 $\mu$m film deposited at 570° C.
2) a 0.78 $\mu$m film deposited at 615° C.
3) a 0.57 $\mu$m film deposited at 570° C.
4) a 0.74 $\mu$m film deposited at 615° C.
5) a 0.59 $\mu$m film deposited at 570° C.

Figure 11:
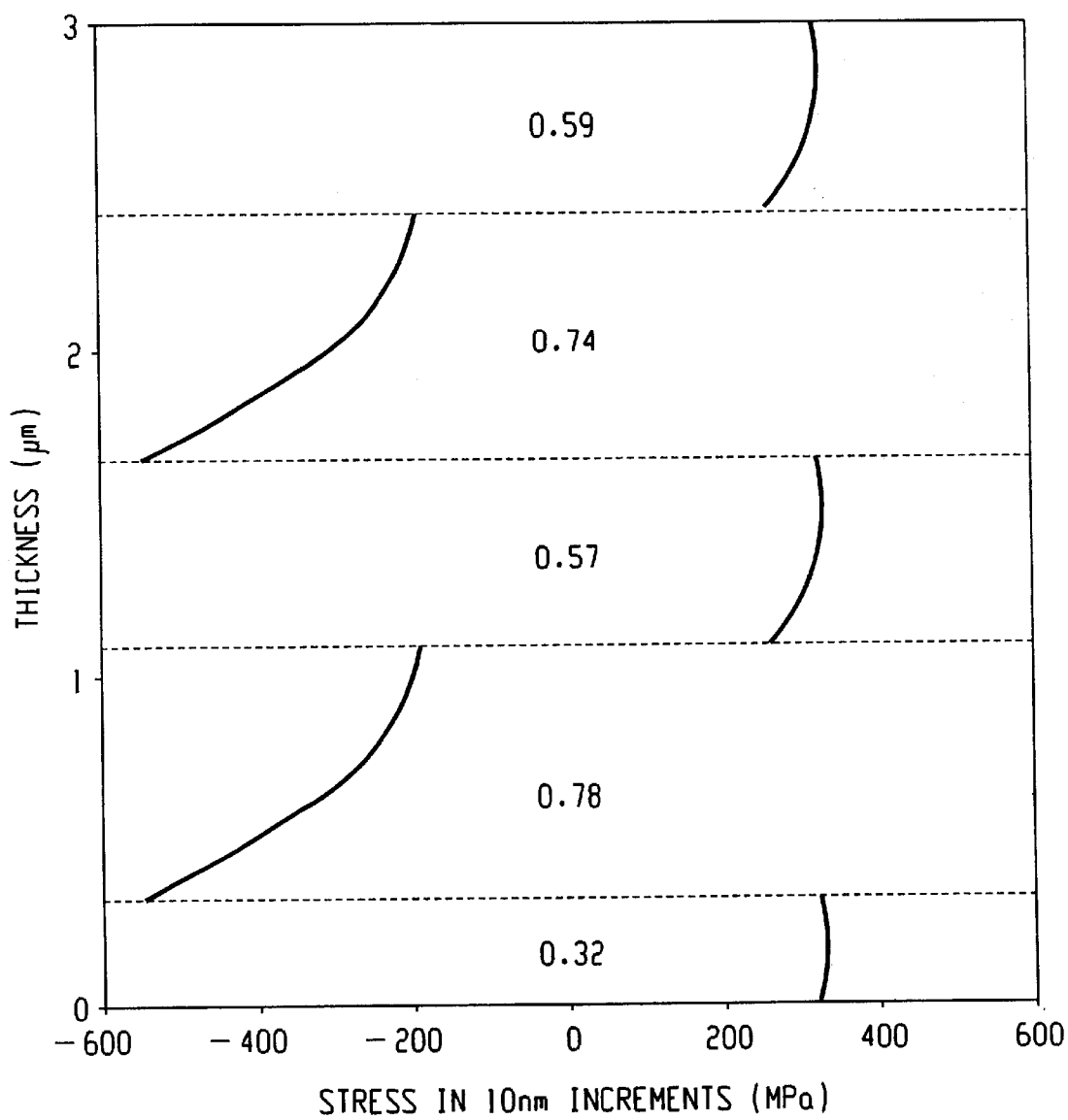
FIG. 11 is a graph illustrating stress distribution in a preferred embodiment five layer polysilicon film.
Figure 12:
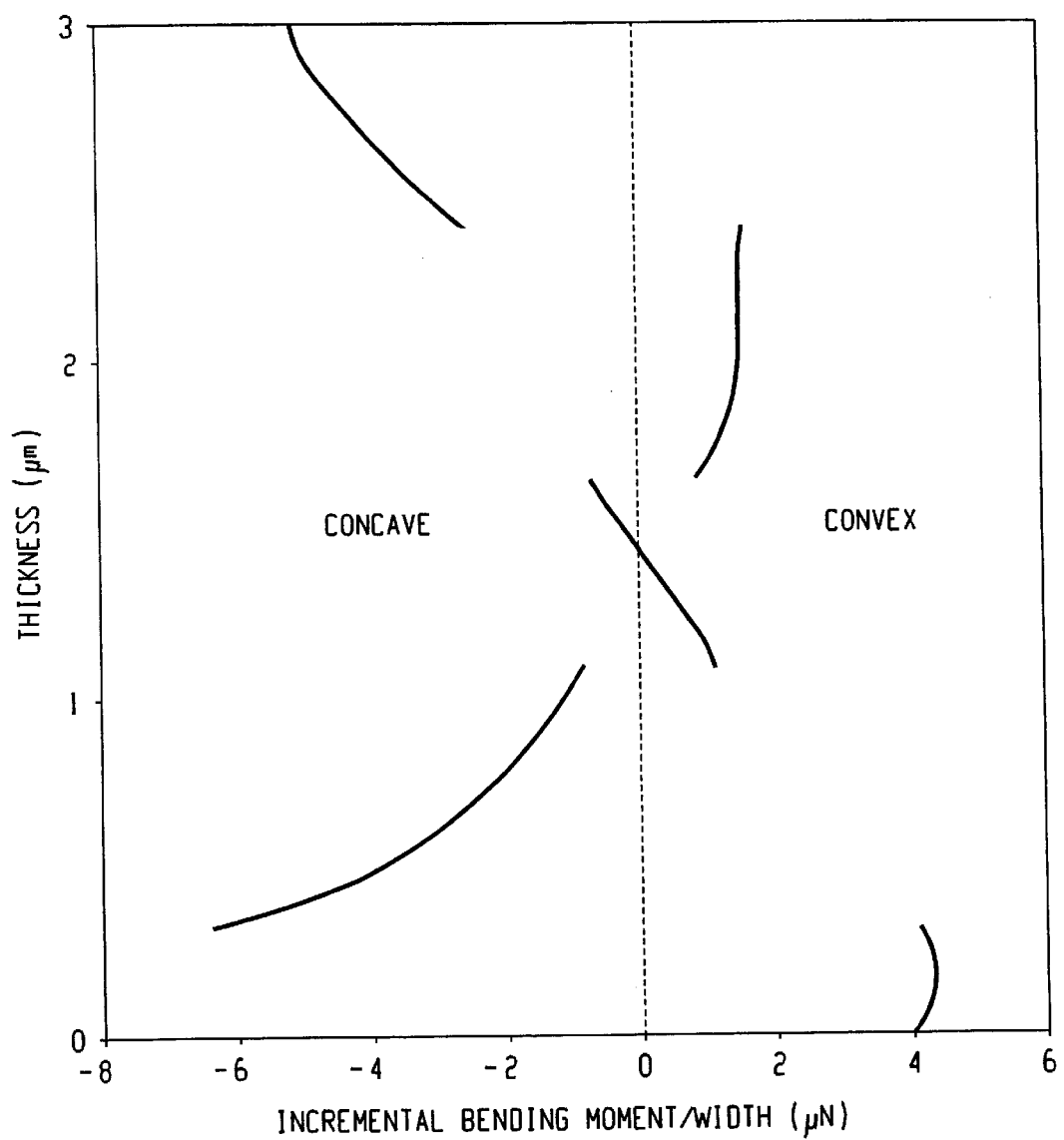
FIG. 12 is a graph illustrating the bending moment contributed by each layer of the film represented in FIG. 11, taken about the center of the film thickness.

This film will display an overall stress of less than 1 MPa, meaning that its overall dimensions will not expand or contract upon release. It will display a stress gradient of 107 MPa/$\mu$m, which will result in the desired radius of curvature upon release. The stress of the film through its thickness is shown in 10 nm increments in FIG. 11, and the bending moment (about the center of the film thickness) contributed by each 10 nm layer is shown in FIG. 12.

When provided with a reflective coating, such as a thin sputtered film of gold, this circle can serve as a focusing mirror. In particular, if the circular mirror remains attached to the substrate at a single point, such as its center, it can be used as a collimating mirror in conjunction with optical fibers as a component in micro-optomechanical devices.

In addition, if an electrical connection is made to the mirror, and a separate electrode is formed on the substrate beneath the mirror, a voltage applied between the two electrodes would create an electrostatic attraction between them. In this manner, it would be possible to cause the mirror to be pulled flat against the substrate, and any optical beam which had been focused by the mirror would become de-focused. This feature would allow the mirror to act as an active optical switch. We have calculated that a 0.7 μm thick, 500 μm diameter mirror, again with a radius of curvature of 2 mm, would become planar at an electrostatic field corresponding to a 15 V potential difference between the film and the substrate.

In yet another series of trials, various multi-layer thin film assemblies were prepared having from 5 to 9 thin film layers. In producing each stacked assembly, particular pairings of deposition temperatures were used, as set forth below. Upon forming each assembly, the overall residual stress was calculated by summing together the stress values from each of the layers comprising the assembly. And, for each assembly, the overall residual stress gradient was calculated by determining the bending moment for each of the layers, and summing together. A summary of these trials is set forth in Table 3.

TABLE 3

| Trial | No. of Layers | Temperatures (° C.) | Stress (Mpa) (+ is tensile) (Includes 1–2 hr. anneal at 615° C.) | Gradient (MPa/μm) (+ is bending down) |
|---|---|---|---|---|
| 1 | 6 | 580/610 | 25 | |
| 2 | 8 | 580/615 | 3 | |
| 3 | 8 | 550/615 | 40 | |
| 4 | 9 | 570/615 | 7 | −18 |
| 5 | 9 | 615/570 | −21 | −40 |
| 6 | 5 | 570/615 | −100 | 40 |
| 7 | 5 | 570/615 | −4 | −100 |
| 8 | 8 | 570/615 | −30 | −35 |

As will be noted, multi-layer assemblies having a wide range of overall stresses were produced, i.e. from −100 to 25 MPa. And, a wide range of overall stress gradients were produced, i.e. −100 to 40 MPa/μm.

Another phenomenon related to the present invention relates to deposition of polysilicon at a specific temperature at the transition between the as-deposited amorphous and as-deposited crystalline regions. Such deposition leads to a polysilicon layer which is crystalline or columnar (compressive) at the bottom and amorphous (tensile) at the top. If performed properly, this could lead to an overall zero-stress film. However, this technique is extremely difficult to control. Other drawbacks of this technique are that it precludes any further processing at higher temperatures, and it can never produce a zero-stress gradient film. Therefore, this is an inferior strategy to the preferred embodiment of the present invention method described herein.

EXAMPLES

The following examples are provided to further illustrate various aspects of the present invention.

Example 1

Formation of a 3 Micron Thick Film With an Overall Stress of Zero and a Stress Gradient of Zero, Using 5 Layers After heating a suitable substrate, a 430 nm thick amorphous or partially devitrified polysilicon layer is deposited at 570° C. The tensile stress of that layer, upon final formation, would be about 265 MPa. A heating period of about 25 minutes is then applied to raise the temperature of the substrate and layer to 615° C. Next, a 855 nm thick predominantly columnar polysilicon layer is deposited at 615° C. That layer exhibits a compressive stress of about 200 MPa. The resulting assembly is then cooled over the course of about 30 minutes. Then, a 430 nm thick amorphous or partially devitrified polysilicon layer is deposited at 570° C. with a tensile stress of approximately 265 MPa. After a 25 minute heating period, a 855 nm thick predominantly columnar polysilicon layer is deposited at 615° C. with a compressive stress of about 200 MPa. After a cooling period, a 430 nm thick amorphous or partially devitrified polysilicon layer is deposited at 570° C. with a tensile stress of about 265 MPa. The resulting multi-layer film is then preferably annealed at 615° C. for one hour to fully crystallize the last amorphous or partially devitrified layer. It may in some applications be desirable to anneal for a longer time period such as 2 or more hours.

Example 2

Formation of a 4 Micron Thick Film With an Overall Stress of 100 MPa Tensile and a Stress Gradient of Zero, Using 7 Layers.

As previously described, after heating a substrate, a 484 nm thick amorphous or partially devitrified polysilicon layer is deposited at 570° C. The tensile stress of that layer would be about 265 MPa. After an additional heating period, a 688 nm thick predominantly columnar polysilicon layer is deposited at 615° C. with a compressive stress of approximately 200 MPa. Then a 484 nm thick amorphous or partially devitrified polysilicon layer is deposited at 570° C. with a tensile stress of about 265 MPa. Next, after a sufficient heating period, a 688 nm thick predominantly columnar polysilicon layer is deposited at 615° C. with a compressive stress of about 200 MPa. Next, after sufficient cooling, a 484 nm thick amorphous or partially devitrified polysilicon layer at 570° C. with a tensile stress of 265 MPa. Then, a 688 nm thick predominantly columnar polysilicon layer is deposited at 615° C. with a compressive stress of about 200 MPa. Next, a 484 nm thick amorphous or partially devitrified polysilicon layer is deposited at 570° C. with a tensile stress of 265 MPa. The resulting multi-layer film is annealed at 615° C. for one hour to fully crystallize the last amorphous or partially devitrified layer.

Example 3

Formation of a 3.0 Micron Thick Film With an Overall Stress of 7 MPa Tensile, Using 9 Layers.

A first devitrified polysilicon layer is formed by silane deposition at 570° C., deposition occurring for 59 minutes. A 25 minute heating period is used to allow the substrate to reach a temperature of 615° C. Then, a 54 minute deposition period is used to form the second layer, a predominantly columnar layer. A 30 minute cooling period is used to allow the substrate and layers to cool to 570° C. Then, the third layer is formed by silane deposition for a period of 118 minutes at 570° C. The foregoing process is repeated to form layers 4 (54 minutes deposition at 615° C.), 5 (118 minutes deposition at 570° C.), 6 (54 minutes deposition at 615° C.), 7 (118 minutes deposition at 570° C.), and 8(54 minutes deposition at 615° C.). The top and last layer, layer 9, is formed in a similar fashion as the first layer, layer 1. Layer 9 is preferably formed by using a deposition time period of 59 minutes at 570° C. It is instructive that the time period for deposition of the first and last layers is each about 59 minutes, which is one-half the deposition time for each of layers 3, 5, and 7. This provides for selectively producing an overall desired stress characteristic while also providing a relatively smooth outer finish.

Example 4

Formation of a 2.8 Micron Thick Film With an Overall Stress of 17 MPa Tensile, Using 9 Layers.

The same procedure may be utilized as previously described with regard to Example 3 with the exception that instead of utilizing a deposition time of 54 minutes for layers 2, 4, 6, and 8, a shorter time period of 51 minutes is employed.

Example 5

Formation of a 0.4 Micron Thick Film With an Overall Stress of 2 MPa Tensile, Using 3 Layers.

A first polysilicon layer is formed by silane deposition for 46 minutes at 550° C. Prior to this a 25 minutes heating period is utilized to ensure that the receiving substrate is at a uniform temperature of 550° C. After deposition of the first layer, another 25 minute heating period is employed to ensure that the assembly is at a temperature of 615° C. The second layer is then formed by silane deposition for 24 minutes at 615° C. Afterwards, a 30 minute cooling period is used to bring the assembly to a temperature of 550° C. The third layer is then formed by silane deposition for 46 minutes at 550° C. The resulting assembly is annealed for 2 hours at 615° C.

The preferred embodiment multi-layer polysilicon assembly may be used in a wide array of applications. Generally, any application that utilizes polysilicon as a mechanical material could benefit from the present invention. For examples, devices such as accelerometers, pressure sensors, and gyroscopes could utilize the present invention polysilicon multi-layer assemblies. For instance, improved accelerometers could be produced since accuracy of such devices stems from their signal to noise ratio, which ratio could be improved by constructing larger sensor structures. Additional applications and uses are contemplated for the present invention such as optical uses and RF wireless communication uses. Generally, the present invention provides improved stability, more predictable behavior and enables more precise design and engineering.

The present invention has been described with reference to the preferred embodiments and noted applications. Obviously, modifications and alterations will occur to others upon a reading and understanding of the preceding detailed description. It is intended that the invention be construed as including all such alterations and modifications in so far as they are within the scope of the claims or the equivalents thereof. For example, it is contemplated by the present inventors that the techniques and strategies associated with the invention may be utilized when depositing nearly any type of material, and particularly in forming multi-layer stacked assemblies of thin films.

Having thus described the invention, we claim:

1. A method for producing a multi-layer assembly of polysilicon thin films, said assembly having a predetermined overall bending moment, said method comprising:
    providing a substrate;
    forming a first polysilicon thin film layer on said substrate such that said first layer has a devitrified microstructure and an internal tensile stress, a first thickness and a first location within said assembly to result in a first moment, said first layer formed by chemical vapor deposition of silane at a temperature of from about 550° C. to about 590° C.;
    forming a second polysilicon thin film layer on said first layer such that said second layer has a predominantly columnar microstructure and an internal compressive stress, a second thickness and a second location within said assembly to result in a second moment, said second layer formed by chemical vapor deposition of silane at a temperature of from about 600° C. to about 700° C.; and
    forming successive polysilicon thin film layers on said first and second layers such that each successive layer (i) has either a devitrified microstructure and an internal tensile stress formed by chemical vapor deposition of silane at a temperature of from about 550° C. to about 590° C., or a predominantly columnar microstructure and an internal compressive stress formed by chemical vapor deposition of silane at a temperature of from about 600° C. to about 700° C., (ii) has a microstructure that is different than the microstructure of an adjacent layer, and (iii) has a thickness and is disposed at a location in said multi-layer assembly such that said successive layer has a moment that when summed with said first moment, said second moment, and any other moments from said successive layers, results in said predetermined overall bending moment of said multi-layer assembly.

2. The method of claim 1 wherein at least one of said polysilicon thin films having a devitrified microstructure is formed by chemical vapor deposition of silane at a temperature of from about 570° C. to about 580° C.

3. The method of claim 1 wherein at least one of said polysilicon thin films having a predominantly columnar microstructure is formed by chemical vapor deposition of silane at a temperature of about 605° C. to about 650° C.

4. The method of claim 1 wherein said assembly has a total thickness of from about 1 micron to about 10 microns.

5. The method of claim 1 wherein each of said polysilicon thin films has a thickness from about 100 nm to about 1000 nm.

6. The method of claim 1 wherein said polysilicon thin film layer constituting an exterior face has a surface finish roughness less than about 50 nm.

7. The method of claim 6 wherein said surface finish roughness is less than about 25 nm.

8. A method for producing a multi-layer assembly of polysilicon thin films, said assembly having a predetermined overall bending moment, said method comprising:
    providing a substrate;
    forming a first polysilicon thin film layer on said substrate such that said first layer has a predominantly columnar microstructure and an internal compressive stress, a first thickness and a first location within said assembly to result in a first moment, said first layer formed by chemical vapor deposition of silane at a temperature of from about 600° C. to about 700° C.;
    forming a second polysilicon thin film layer on said first layer such that said second layer has a devitrified microstructure and an internal tensile stress, a second thickness and a second location within said assembly to result in a second moment, said second layer formed by chemical vapor deposition of silane at a temperature of from about 550° C. to about 590° C.; and
    forming successive polysilicon thin film layers on said first and second layers such that each successive layer (i) has either a devitrified microstructure and an internal tensile stress formed by chemical vapor deposition of silane at a temperature of from about 550° C. to about 590° C., or a predominantly columnar microstructure and an internal compressive stress formed by chemical vapor deposition of silane at a temperature of from about 600° C. to bout 700° C., (ii) has a microstructure that is different than the microstructure of an adjacent layer, and (iii) has a thickness and is disposed at a location in said multi-layer assembly such that said successive layer has a moment that when summed with said first moment, said second moment, and any other moments from said successive layers, results in said predetermined overall bending moment of said multi-layer assembly.

9. The method of claim 8 wherein at least one of said polysilicon thin films having a devitrified microstructure is formed by chemical vapor deposition of silane at a temperature of from about 570° C. to about 580° C.

10. The method of claim 8 wherein at least one of said polysilicon thin films having a predominantly columnar microstructure is formed by chemical vapor deposition of silane at a temperature of about 605° C. to about 650° C.

11. The method of claim 8 wherein said assembly has a total thickness of from about 1 micron to about 10 microns.

12. The method of claim 8 wherein each of said polysilicon thin films has a thickness from about 100 nm to about 1000 nm.

13. The method of claim 8 wherein said polysilicon thin film layer constituting an exterior face has a surface finish roughness less than about 50 nm.

14. The method of claim 13 wherein said surface finish roughness is less than about 25 nm.

15. A method of forming a multi-layer thin film assembly comprising a plurality of polysilicon thin films, said multi-layer assembly having a selectively determinable overall bending moment, said method comprising:

forming on a substrate at least one of a first polysilicon thin film having either (i) a devitrified microstructure and an internal tensile stress by chemical vapor deposition of silane at a temperature of from about 550° C. to about 590° C. and a thickness of from about 100 nm to about 1000 nm, or (ii) a predominantly columnar microstructure and an internal compressive stress by chemical vapor deposition of silane at a temperature of from about 600° C. to about 700° C. and a thickness of from about 100 nm to about 1000 nm;

forming at least one of a second polysilicon thin film immediately adjacent to said first polysilicon thin film, said second polysilicon thin film having either: (i) a devitrified microstructure and an internal tensile stress by chemical vapor deposition of silane at a temperature of from about 550° C. to about 590° C. and a thickness of from about 100 nm to about 1000 nm, or (ii) a predominantly columnar microstructure and an internal compressive stress by chemical vapor deposition of silane at a temperature of from about 600° C. to about 700° C. and a thickness of from about 100 nm to about 1000 nm, whereby the microstructure of said second film is different than the microstructure of said first film;

whereby each of said films is formed at a location in said multi-layer assembly such that the sum of the moments of each of said thin film layers corresponds to said overall bending moment.

16. The method of claim 15 wherein said thin film having a devitrified microstructure is formed by chemical vapor deposition of silane at a temperature of from about 570° C. to about 580° C.

17. The method of claim 16 wherein said thin film layer having a devitrified microstructure is formed by chemical vapor deposition at a temperature of about 570° C.

18. The method of claim 15 wherein said thin film having a predominantly columnar microstructure is formed by chemical vapor deposition of silane at a temperature of from about 605° C. to about 650° C.

19. The method of claim 18 wherein said thin film having a predominantly columnar microstructure is formed by chemical vapor deposition of silane at a temperature of about 615° C.

20. The method of claim 15 wherein said polysilicon thin film layer constituting an exterior face has a surface finish roughness less than about 50 nm.

21. The method of claim 20 wherein said surface finish roughness is less than about 25 nm.

* * * * *